United States Patent
Choi

(10) Patent No.: US 6,542,041 B2
(45) Date of Patent: Apr. 1, 2003

(54) PHASE LOCKED LOOP FOR STABLE CLOCK GENERATION IN APPLICATIONS OF WIDE BAND CHANNEL CLOCK RECOVERY AND OPERATION METHOD THEREOF

(75) Inventor: Dong-myung Choi, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 100 days.

(21) Appl. No.: 09/768,942

(22) Filed: Jan. 24, 2001

(65) Prior Publication Data

US 2001/0015677 A1 Aug. 23, 2001

(30) Foreign Application Priority Data

Feb. 7, 2000 (KR) .......................................... 2000-5651

(51) Int. Cl.[7] .......................... H03L 7/06; H03L 7/087; H03L 7/093
(52) U.S. Cl. ........................ 331/17; 331/11; 331/25; 331/175; 327/157; 327/159; 369/47
(58) Field of Search ............................... 331/17, 11, 175, 331/25, 57; 327/536, 157, 159; 369/47, 32, 44.11

(56) References Cited

U.S. PATENT DOCUMENTS 5,121,086 A    6/1992  Srivastava .................... 331/11

6,229,362 B1 *  5/2001  Choi .......................... 327/157

* cited by examiner

*Primary Examiner*—Arnold Kinkead
(74) *Attorney, Agent, or Firm*—Mills & Onello, LLP

(57) ABSTRACT

A phase locked loop (PLL) and method for stable clock generation in applications of wide band channel clock recovery performs frequency detection and phase detection with respect to an eight to fourteen modulation (EFM) signal and a PLL clock signal, and adjusts the current based on the results of the frequency detection and the phase detection, thereby generating the PLL clock signal synchronized with the EFM signal. The PLL includes a charge pump, a first low-pass filter, a voltage controlled oscillator and a static phase error controller. The charge pump sources or sinks the current in response to the results of the frequency detection and the phase detection and outputs the result of sourcing or sinking the current. The first low-pass filter low-pass filters the signal output from the charge pump and outputs the filtered result as a direct current control voltage. The voltage controlled oscillator receives the control voltage and a predetermined reference voltage by way of differential input, converts a voltage into a current, and delays an oscillation output signal based on the converted current, thereby generating the PLL clock signal. The static phase error controller compares the control voltage with a triangular signal having a predetermined period and a predetermined amplitude and changes the reference voltage based on the compared result. Accordingly, stable clock generation can be achieved by regularly maintaining the VCO control voltage even if the static phase error occurs while the PLL is recovering a wide band channel clock.

7 Claims, 5 Drawing Sheets

PHASE LOCKED LOOP FOR STABLE CLOCK GENERATION IN APPLICATIONS OF WIDE BAND CHANNEL CLOCK RECOVERY AND OPERATION METHOD THEREOF

BACKGROUND OF THE INVENTION

1. Field of the Invention

The present invention relates to an optical system, and more particularly, to a phase locked loop for stable clock generation in applications of wide band channel clock recovery, and an operation method thereof.

2. Description of the Related Art

Generally, an optical system employs a phase locked loop (PLL) for bit clock generation. In the operation of the PLL, a static phase error is essential to clock generation. The static phase error indicates a state in which the phases of two input signals are different even in the case where the input signals are frequency-locked. When an optical instrument reads data recorded on an optical disc using a servo system of a constant angular velocity (CAV), the frequency of a voltage controlled oscillator (VCO) changes by a factor of 1.5 while a pickup moves from the innermost part to the outermost part of the optical disc. Accordingly, the control voltage of the VCO should be continuously changed. However, as the VCO control voltage changes in a conventional PLL, the threshold voltage does not change, thereby causing an error. This error is referred to as a static phase error. Since a bit error rate (BER) can be momentarily changed depending on the static phase error, the static phase error is considered as an essential factor. When current mismatching occurs between a PMOS transistor constructing a current source and an NMOS transistor constructing a current sink in the charge pump of the PLL, a current offset may occur. Accordingly, a phase error may occur at the point of change in current. In other words, the static phase error occurs due to a difference between the frequency responses of transistors operating as switching devices of the charge pump.

Conventionally, a technique for addressing the issue of a varying BER uses the characteristic of a VCO control voltage, i.e., low-pass filtered direct current voltage, changing when a static phase error occurs. In this method, when the low-pass filtered direct current voltage changes, the variation of the low-pass filtered direct current voltage is detected by an error amplifier and a threshold detector. Accordingly, a VCO is compensated for by a voltage corresponding to the variation caused by the static phase error through a digital-to-analog converter. In other words, when a conventional PLL has a wide frequency band, a VCO control voltage changes so that a threshold essential to control cannot be detected. Alternatively, when using a conventional method of detecting a threshold, a VCO voltage changes and is offset from a center voltage. Then, in a charge pump, the charging current is different from the discharging current so that a regular static phase error cannot be obtained.

For these reasons, the conventional method using a VCO control voltage cannot be applied to the CAV mode widely used in optical systems. In other words, since the VCO control voltage always changes in the CAV mode, it cannot be determined whether the change in voltage is due to a static phase error or due to CAV control. Accordingly, the conventional method described above is restrictively applied only to clock synthesis applications or to the constant linear velocity (CLV) of an optical instrument.

SUMMARY OF THE INVENTION

To address the above limitations, it is an object of the present invention to provide a phase locked loop for stable clock generation in applications of wide band channel clock recovery, in which a clock signal can be stably regenerated with respect to a static phase error when an optical system operates at a constant angular velocity.

It is another object of the present invention to provide a static phase error control method performed in the phase locked loop.

Accordingly, to achieve one object of the invention, there is provided a phase-locked loop (PLL) performing frequency detection and phase detection with respect to an eight to fourteen modulation (EFM) signal and a PLL clock signal and adjusting the current based on the results of the frequency detection and the phase detection, thereby generating the PLL clock signal synchronized with the EFM signal. The PLL includes a charge pump, a first low-pass filter, a voltage controlled oscillator and a static phase error controller. The charge pump sources or sinks the current in response to the results of the frequency detection and the phase detection and outputs the result of sourcing or sinking the current. The first low-pass filter low-pass filters the signal output from the charge pump and outputs the filtered result as a direct current control voltage. The voltage controlled oscillator receives the control voltage and a predetermined reference voltage by way of differential input, converts a voltage into a current, and delays an oscillation output signal based on the converted current, thereby generating the PLL clock signal. The static phase error controller compares the control voltage with a triangular signal having a predetermined period and a predetermined amplitude and changes the reference voltage based on the compared result.

To achieve the other object of the invention, there is provided a method of controlling a static phase error in a phase locked loop (PLL) including a charge pump for adjusting the amount of current in response to the results of performing frequency detection and phase detection with respect to an eight to fourteen modulation (EFM) signal and a PLL clock signal, and a voltage controlled oscillator for generating the PLL clock signal in response to a direct current control voltage corresponding to the adjusted amount of the current and in response to a predetermined reference voltage. First, in step (a), it is determined whether the control voltage changes in a predetermined operating mode. In step (b), the control voltage is adjusted in the opposite direction to the change of the control voltage when it is determined that the control voltage changes. In step (c), it is determined whether the control voltage is at a center voltage after the step (b). In step (d), the PLL clock signal corresponding to the control voltage is generated when it is determined that the control voltage is at the center voltage. In step (e), the EFM signal and the PLL clock signal are received, and frequency detection and phase detection are performed with respect to them.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF PREFERRED EMBODIMENTS

Figure 1:
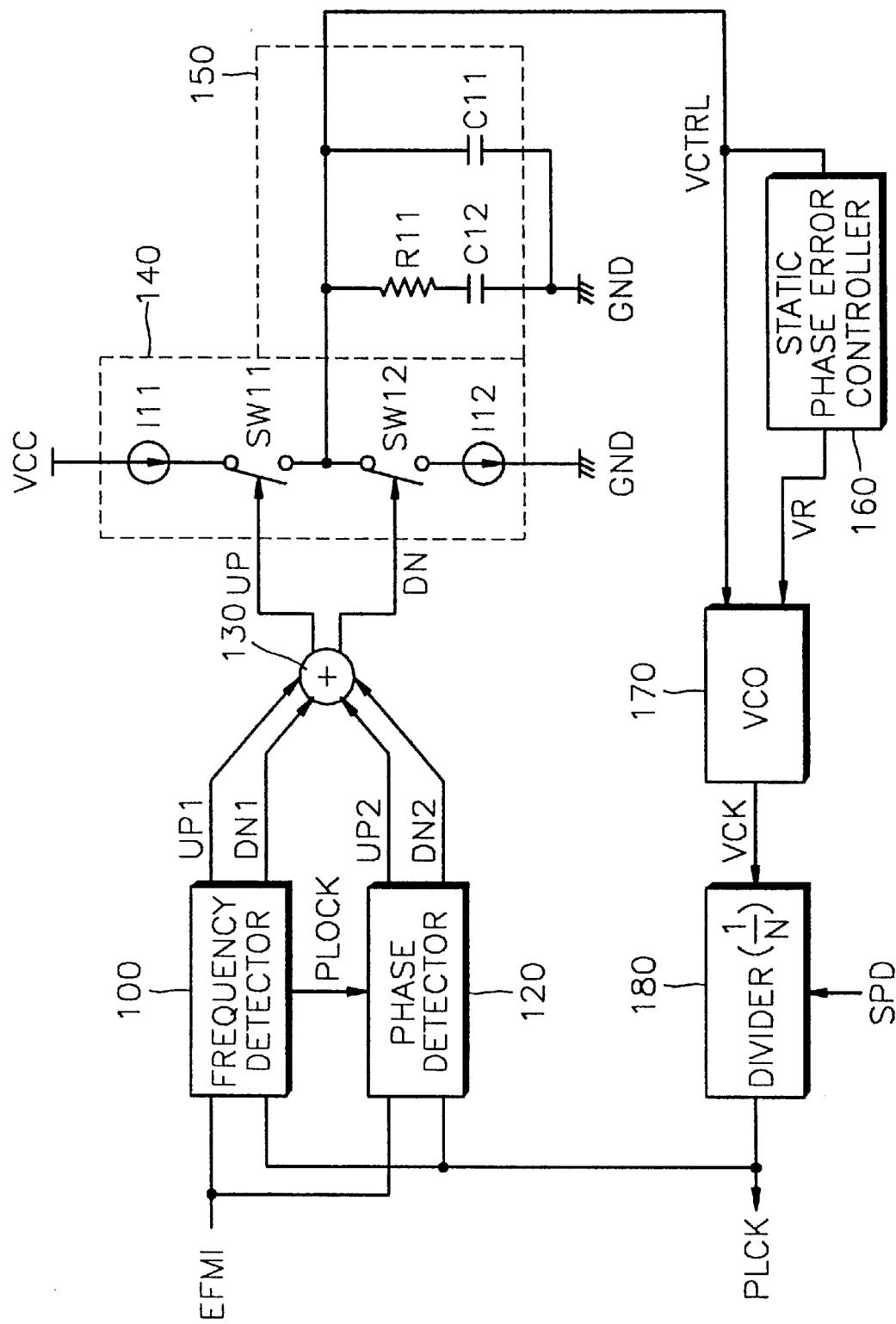
FIG. 1 is a block diagram of a phase locked loop for channel clock recovery according to an embodiment of the present invention.

Hereinafter, embodiments of the present invention will be described in detail with reference to the attached drawings. Referring to FIG. 1, a phase locked loop includes a frequency detector 100, a phase detector 120, an adder 130, a charge pump 140, a low-pass filter 150, a static phase error controller 160, a voltage controlled oscillator (VCO) 170, and a divider 180.

The frequency detector 100 detects the frequency difference between an eight to fourteen modulation (EFM) signal EFMI and a phase locked loop (PLL) clock signal PLCK provided by the divider 180, and generates a first up signal UP1 and a first down signal DN1 which correspond to the detected frequency difference. The frequency detector 100 also outputs a locking detection signal PLOCK to the phase detector 120 in the frequency-locking state in which the frequency of the EFM signal EFMI is identical to the frequency of the PLL clock signal PLCK.

The phase detector 120 detects the phase difference between the EFM signal EFMI and the PLL clock signal PLCK in response to the locking detection signal PLOCK from the frequency detector 100, and generates a second up signal UP2 and a second down signal DN2 which correspond to the detected result.

The adder 130 adds the first up signal UP1 and the first down signal DN1 from the frequency detector 100 to the second up signal UP2 and the second down signal DN2 from the phase detector 120, respectively, and generates an up signal UP and a down signal DN which correspond to the added results.

The charge pump 140 adjusts sourcing and sinking currents in response to the up signal UP and the down signal DN from the adder 130. More specifically, the charge pump 140 adjusts the amount of current sourced in response to the up signal UP and adjusts the amount of current sunken in response to the down signal DN. For this operation, the charge pump 140 includes a current generator |I1 serving as a current source, a switch SW11 for controlling the sourcing of the current, a current generator |I2 serving as a current sink, and a switch SW12 for controlling the sinking of the current. The operation of the charge pump 140 will be described. The up signal UP applied from the adder 130 is generated as a signal which maintains a "high" level for an interval corresponding to a predetermined pulse width, for example, the pulse width of half a period of the PLL clock signal PLCK, in response to the frequency difference detected by the frequency detector 100 and the phase difference detected by the phase detector 120. The switch SW11 of the charge pump 140 is turned on by the "high" level of the up signal UP, and a predetermined current corresponding to the current of the current generator |I1 is sourced. After the up signal UP is generated, a "high" level of the down signal DN having a predetermined pulse width is generated. When the down signal DN is generated, the switch SW12 of the charge pump 140 is turned on. Then, current corresponding to the current of the current generator |I2 is sunken through a ground GND. Here, a static phase error may occur due to current mismatching or a difference between frequency responses of switching transistors in the charge pump 140.

The low-pass filter 150 low-pass filters a signal output from the charge pump 150 and generates a direct current VCO control voltage VCTRL corresponding to the result of the low-pass filtering. The low-pass filter 150 is composed of a resistor R11 and capacitors C11 and C12.

The VCO 170 receives the VCO control voltage VCTRL output from the low-pass filter 150 and a reference voltage VR by way of differential input and converts the input into current. Here, a VCO output signal is delayed by a predetermined period of time in response to the converted current, and, as a result of the delay, a PLL clock signal PLCK is generated. The PLL clock signal PLCK may be set to the VCO oscillation signal VCK which has been frequency-divided by a number N. Preferably, the VCO 170 is manifested as a differential ring oscillator. Here, the reference voltage VR input to the VCO 170 may be changed by the static phase error controller 160. Moreover, a threshold cannot be detected in a wide band clock recovery circuit in which a target frequency of the PLL clock signal PLCK always changes. Accordingly, when the control voltage is regularly maintained, occurrence of a static phase error can be prevented since the primary cause of the static phase error is current mismatch in the charge pump 140.

The static phase error controller 160 compares the direct current VCO control voltage VCTRL output from the low-pass filter 150 with a predetermined triangular signal and changes the reference voltage VR of the VCO 170 based on the result of the comparison. In other words, when a static phase error occurs due to the current mismatch of the charge pump 140, the static phase error is reflected to the reference voltage VR. When the VCO control voltage VCTRL changes due to the occurrence of a static phase error due to a change in current in the charge pump 140, the reference voltage VR is adjusted so that the VCO control voltage VCTRL can be regularly maintained.

The divider 180 divides the frequency of the output signal VCK of the VCO 170 by a predetermined number N in response to an externally applied frequency dividing number adjusting signal SPD and generates a PLL clock signal PLCK, i.e., a regenerated clock signal, as a result of the frequency division.

Figure 2:
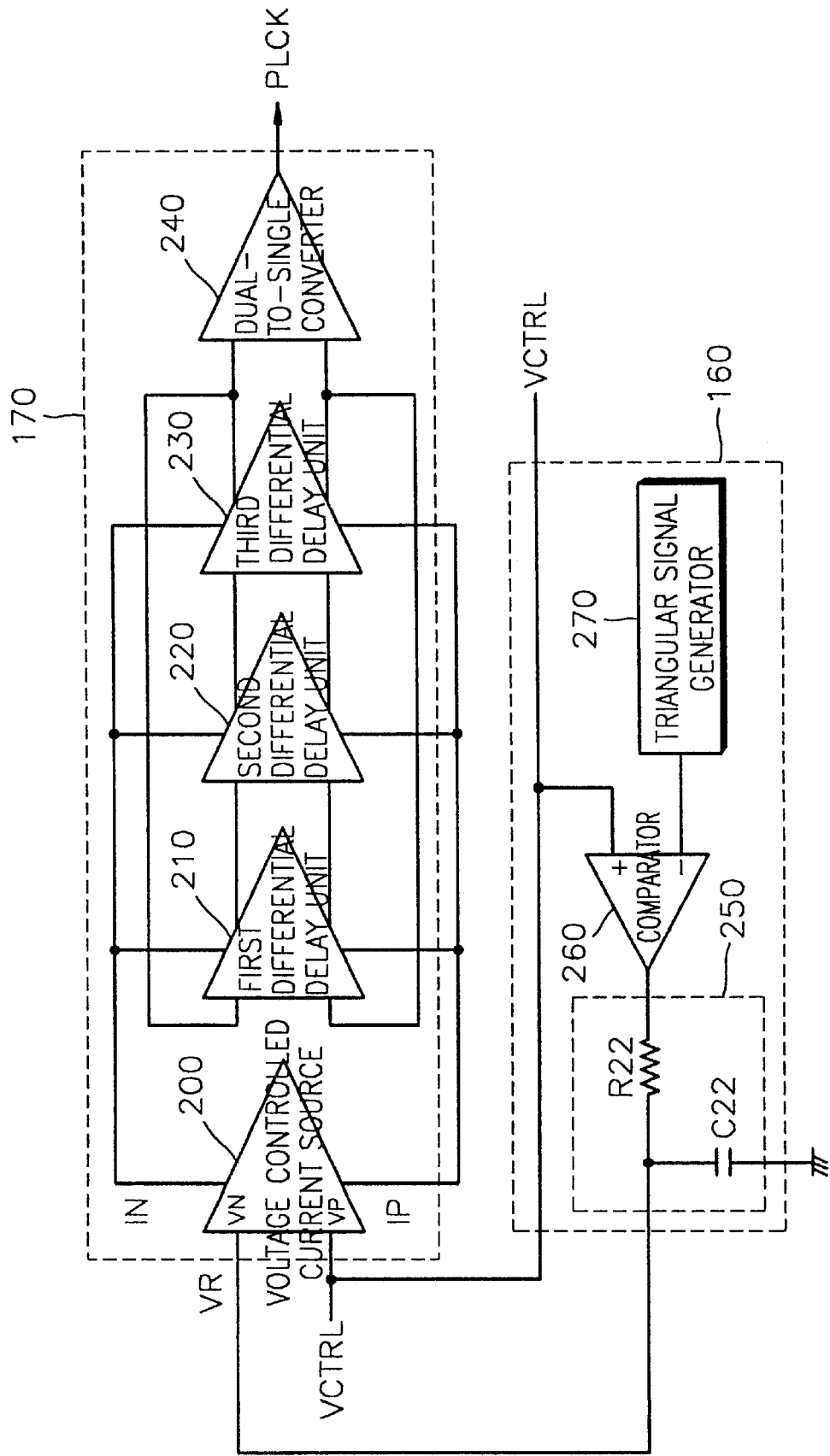
FIG. 2 is a detailed circuit diagram showing the voltage controlled oscillator (VCO) and the static phase error controller of the phase locked loop of FIG. 1.

FIG. 2 is a detailed circuit diagram showing the VCO 170 and the static phase error controller 160 of the circuit of FIG. 1. Referring to FIG. 2, the VCO 170 includes a voltage controlled current source 200, a first differential delay unit 210, a second differential delay unit 220, a third differential delay unit 230 and a dual-to-single converter 240.

The voltage controlled current source 200 receives the reference voltage VR generated by the static phase error controller 160 and the VCO control voltage VCTRL output from the low-pass filter 150 by way of differential input and converts the input voltage into current. A current output through the positive output terminal of the voltage controlled current source 200 is set as IP, and a current output through the negative output terminal of the voltage controlled current source 200 is set as IN.

The first through third differential delay units 210 through 230 are connected in series and each indicates a differential delay cell. Each of the first through third differential delay units 210 through 230 determines a delay time in response to the currents IN and IP generated by the voltage controlled current source 200. Each of the first through third differential delay units 210 through 230 also delays differential oscillation output signals from the third differential delay unit 230 by the determined delay time.

The dual-to-single converter 240 converts the differential oscillation signals, which are output through the first, second and third differential delay units 210, 220 and 230, into a single output signal. The single output signal is frequency-divided to output a PLL clock signal PLCK. As described above, the present invention uses the VCO 170 of a differential type, typically used in high-frequency applications, in order to ensure stable operation regardless of power noise.

The static phase error controller 160 of FIG. 2 includes a triangular signal generator 270, a comparator 260 and a low-pass filter 250.

The triangular signal generator 270 generates a triangular signal having a predetermined period on the basis of the center voltage of the VCO control voltage VCTRL.

Figure 3:
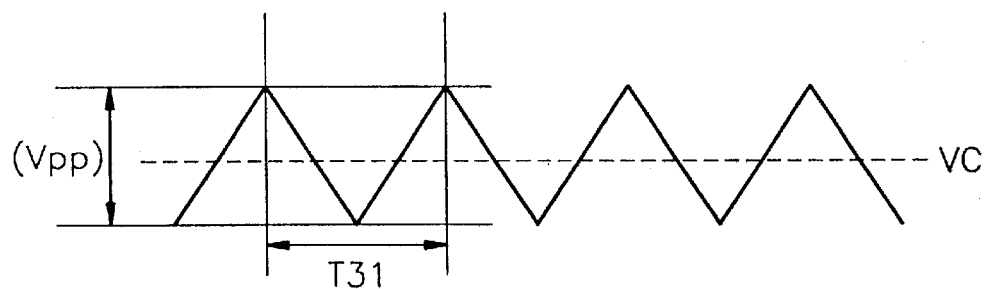
FIG. 3 is a diagram for explaining a triangular signal generated from the static phase error controller of FIG. 2.

FIG. 3 shows the triangular signal generated by the triangular signal generator 270 of FIG. 2. Referring to FIG. 3, Vpp (a peak to peak amplitude) indicates the voltage swing range of the triangular signal and also indicates the maximum voltage swing range of the VCO control voltage VCTRL. T31 indicates the period of the triangular signal, and VC indicates the center voltage of the VCO control voltage VCTRL.

The comparator 260 receives the VCO control voltage VCTRL and the triangular signal generated by the triangular signal generator 270 through a positive input terminal and a negative input terminal, respectively, and compares the amplitudes of the VCO control voltage VCTRL and the triangular signal. A signal output from the comparator 260 has a "high" level or a "low" level.

The low-pass filter 250 low-pass filters the output signal of the comparator 260 and generates a direct current reference voltage VR corresponding to the result of the low-pass filtering. For this operation, the low-pass filter 250 includes a resistor R22 and a capacitor C22.

In the VCO 170 having the structure shown in FIG. 2, the frequency $f_{PLCK}$ of a PLL clock signal PLCK output from the VCO 170 can be represented by the following equation.

$$f_{PLCK} \propto \frac{i}{2C} * \frac{1}{V} \quad (1)$$

where C indicates the output load of the first through third differential delay units 210, 220 and 230, V indicates the voltage swing range of the PLL clock signal PLCK, and i indicates the converted current output from the voltage controlled current source 200. In the operation of the VCO 170, C and V can be considered as fixed values. Accordingly, it is the current i that changes in the operation of the VCO 170, and the current i changes when the VCO control voltage VCTRL changes due to a static phase error. When the current i changes, the frequency $f_{PLCK}$ of the PLL clock signal PLCK changes. It is ideal that the absolute value of the static phase error is 0. However, it is practically unachievable that the static phase error is 0 in a constant angular velocity (CAV) mode in which an optical instrument operates at a constant angular velocity. Accordingly, the static phase error appears with a regular value. In the CAV mode, stable operation can be satisfactorily achieved by the static phase error having a regular value. Generally, as a pickup moves from the innermost part of a disc to the outermost part of the disc, the frequency of a regenerated PLL clock signal PLCK increases. When the frequency of the PLL clock signal PLCK increases, the VCO control voltage VCTRL continuously increases.

Figure 4:
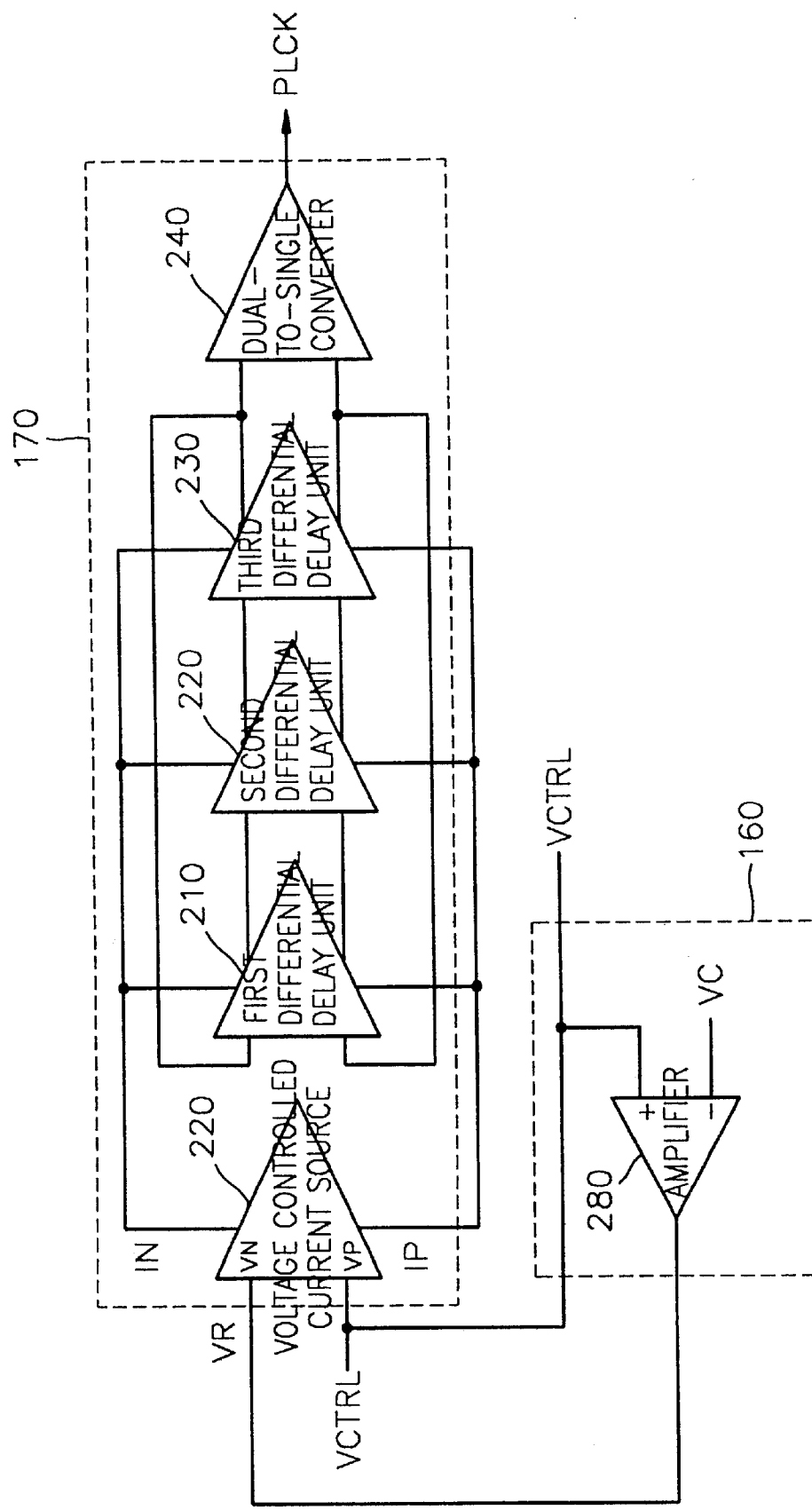
FIG. 4 is a circuit diagram of another embodiment of the static phase error controller of FIG. 1.

FIG. 4 shows another embodiment of the static phase error controller 160 of FIG. 1. Referring to FIG. 4, the static phase error controller 160 can be manifested as an amplifier 280. A VCO 170 of FIG. 4 has the same structure as the VCO of FIG. 2, and thus the same reference numerals are used for the same members. The structure and detailed operation of the VCO 170 of FIG. 4 will be omitted.

The amplifier 280 receives the VCO control voltage VCTRL and a center voltage VC through a positive input terminal and a negative input terminal, respectively, and amplifies the input voltage. When the static phase error controller 160 is manifested as the amplifier 280, the triangular signal generator 270 and the low-pass filter 250 of FIG. 2 are not used.

Figure 5:
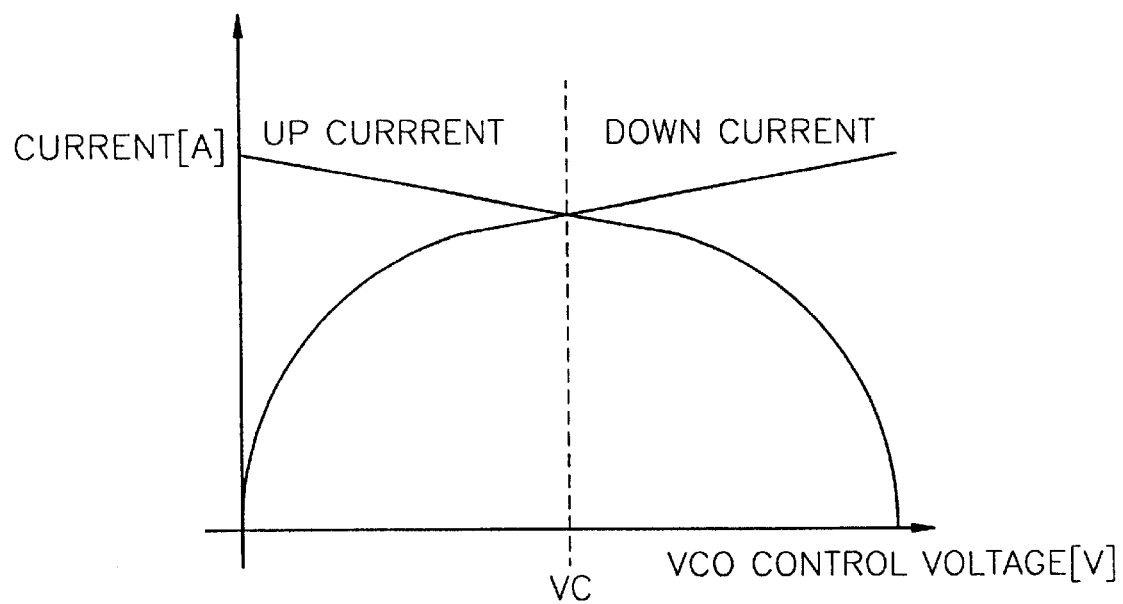
FIG. 5 is a diagram showing the relation between the current of the charge pump and a VCO voltage in the phase locked loop of FIG. 1.

FIG. 5 shows the relation between the current flowing in the charge pump 140 and the VCO control voltage VCTRL. Referring to FIG. 5, in the interval in which an up current, i.e., a sourcing current, flowing due to an up signal UP from the adder 130 is nearly equal to a down current, i.e., a sinking current, flowing due to a down signal DN output from the adder 130, the VCO control voltage VCTRL is at a center voltage VC. Accordingly, as shown in FIG. 5, when the VCO control voltage VCTRL is offset from the center voltage, the difference between the charging current and the discharging current in the charge pump 140 increases. As described above, when the VCO control voltage VCTRL is offset from the center voltage, a static phase error is not regular, but instead continuously changes depending on whether the inner or outer portions of a disc are being read. In other words, when the VCO control voltage is always maintained at the center voltage, a regular static phase error can be obtained. PLL must therefore be able to handle the CAV mode while maintaining the VCO control voltage VCTRL at the center voltage.

The present invention takes advantage of the fact that a regular static phase error can be obtained when the VCO control voltage VCTRL is always at the center voltage VC, thereby controlling the static phase error to be regular in the CAV mode. The static phase error is assumed to be a static phase error which may occur, for example, due to the amount of current in the charge pump 140. In addition, the present invention receives the VCO control voltage VCTRL and a reference voltage VR corresponding to the VCO control voltage VCTRL using the differential type VCO 170. Consequently, a PLL according to the present invention is composed of two loops. One for performing the essential locking function of the PLL is shown in FIG. 1, and the other being a loop formed by the static phase error controller 160.

Figure 6:
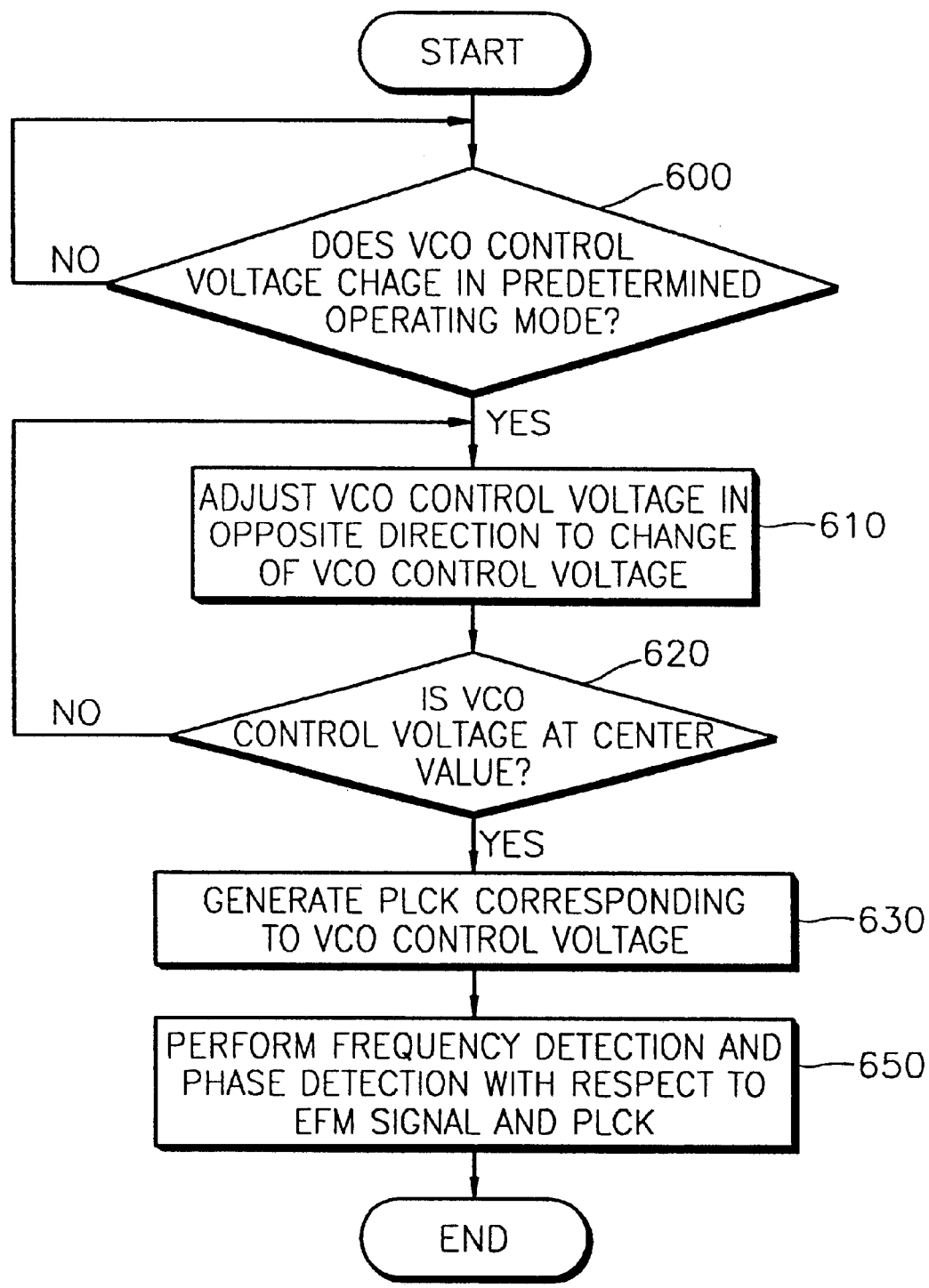
FIG. 6 is a flowchart of a static phase error control method performed in a phase locked loop according to the present invention.

FIG. 6 is a flowchart for explaining a static phase error control method performed in the VCO 170 and the static phase error controller 160 of FIG. 2. Here, the static phase error controller 160 including the triangular signal generator 270, the comparator 260 and low-pass filter 250 shown in FIG. 2 is used.

With reference to FIGS. 2 through 6, a PLL for stable clock generation in applications of wide band channel clock recovery and an operation method thereof will be described in detail. In step 600, it is determined whether a VCO control voltage VCTRL changes during operation in a predetermined operating mode. The predetermined operating modem can be assumed to be a CAV operating mode. When it is determined that the VCO control voltage VCTRL changes, the VCO control voltage VCTRL is adjusted in the a direction opposite to the change of the VCO control voltage VCTRL based on the result of comparing a triangular signal with the VCO control voltage VCTRL in step 610. More specifically, referring to FIG. 2, the VCO control voltage VCTRL and the reference voltage VR are applied to the voltage controlled current source 200 of the VCO 170 as differential input signals. Generally, when a center voltage VC is input through a reference voltage input terminal, or a separate differential filter is used, in a PLL, the voltage of another low-pass filter is input. However, the present invention does not fix the reference voltage VR to a certain value, but causes the reference voltage VR to vary with an occurring static phase error. Here, the output current of the voltage controlled current source 200 is proportional to the differential value between the VCO control voltage VCTRL and the reference voltage VR. As described above, the present invention fixes the VCO control voltage VCTRL to the center voltage VC and varies the reference voltage VR. It is preferable to set an interval, in which the VCO control voltage VCTRL is maintained at the center voltage VC and in the vicinity of the center voltage VC.

For example, referring to FIG. 3, when the VCO control voltage VCTRL is higher than the center voltage VC due to the static phase error, the operation is as follows. Since the comparator 260 compares the triangular signal shown in FIG. 3 with the VCO control voltage VCTRL, an interval, in which the output signal of the comparator 260 is in a "high" level, decreases. Accordingly, the reference voltage VR, which is output after being filtered by the low-pass filter 250, becomes lower. When the reference voltage VR is lowered, the output current of the voltage controlled current source 200 increases, and consequently, the VCO control voltage VCTRL is lowered. After the reference voltage VR is adjusted in step 610, it is determined whether the VCO control voltage VCTRL is at the center voltage VC in step 620. As described above, when the VCO control voltage VCTRL changes due to the static phase error, the VCO control voltage VCTRL can be compensated by the reference voltage VR.

On the other hand, when the VCO control voltage VCTRL is lower than the center voltage due to the static phase error, an interval in which the output signal of the comparator 260 is at a "high" level increases. Accordingly, the reference voltage VR output after being filtered by the low-pass filter 250 increases. When the reference voltage VR increases, the output current of the voltage controlled current source 200 decreases. Consequently, the VCO control voltage VCTRL increases.

As described above, when the VCO control voltage VCTRL increases or decreases due to the static phase error, the VCO control voltage VCTRL is compensated for a voltage variation by the reference voltage VR so that the VCO control voltage VCTRL can be fixed to the center voltage VC.

Referring back to FIG. 6, when it is determined that the VCO control voltage is at the center voltage VC in step 620, the VCO 170 generates a PLL clock signal PLCK corresponding to the VCO control voltage VCTRL in step 630. Therefore, the PLL performs frequency detection and phase detection with respect to an EFM signal EFMI input in the CAV mode and the PLL clock signal PLCK in step 650. With such an arrangement, the present invention can maintain the VCO control voltage VCTRL in the vicinity of the center voltage VC throughout the reading of an entire disc, even if the static phase error occurs.

Accordingly, in the present invention, a static phase error due to the charge pump 140 in a predetermined operating mode, for example, a CAV mode, can be maintained at a certain value by reflecting a factor causing the static phase error in the charge pump 140 to the response of the VCO 170.

According to the present invention, stable clock generation can be achieved by regularly maintaining a VCO control voltage even if a static phase error occurs during the operation of a wide band PLL. In addition, a bit error rate is uniform by regularly maintaining the static phase error in the CAV mode, and stable operation can be achieved in a fast optical instrument of speed factor 60 or faster in the CAV mode.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A phase locked loop (PLL) which performs frequency detection and phase detection with respect to an eight to fourteen modulation (EFM) signal and a PLL clock signal and adjusts a control current based on the results of the frequency detection and the phase detection, thereby generating the PLL clock signal synchronized with the EFM signal, the PLL comprising:

a charge pump for adjusting the control current in response to the results of the frequency detection and the phase detection and outputting the result as a charge pump output;

a first low-pass filter for low-pass filtering the charge pump output and outputting the filtered result as a control voltage;

a voltage controlled oscillator for receiving the control voltage and a predetermined reference voltage at differential inputs to provide a differential output voltage, converting the differential output voltage into a differential output current, and delaying an oscillation output signal based on the converted differential output current, thereby generating the PLL clock signal; and a static phase error controller for comparing the control voltage with a triangular signal having a predetermined period and a predetermined amplitude to provide a comparison result and changing the reference voltage based on the compared result.

2. The phase locked loop of claim 1, wherein the static phase error controller comprises:

a triangular signal generator for generating the triangular signal such that the reference level of the triangular signal is set to a center value of the control voltage;

a comparator for receiving the control voltage through a positive input terminal and for receiving the triangular signal through a negative input terminal and for comparing their respective amplitudes to provide a comparator output signal; and a second low-pass filter for low-pass filtering the comparator output signal to provide a filtered result and outputting the filtered result as the reference voltage.

3. The phase locked loop of claim 1, wherein the static phase error controller comprises an amplifier which receives the control voltage through a positive input terminal and a center voltage of the control voltage through a negative input terminal, amplifies the input voltage by a predetermined amplification factor to provide an amplified result, and outputs the amplified result as the reference voltage.

4. The phase locked loop of claim 1, wherein the static phase error controller adjusts the reference voltage by a variation of the control voltage when the control voltage changes due to a static phase error, thereby maintaining the control voltage at a constant value.

5. The phase locked loop of claim 1, wherein the voltage controlled oscillator comprises a ring oscillator receiving the control voltage and the reference voltage by way of differential input, and wherein the control voltage is maintained at a center voltage.

6. A method of controlling a static phase error in a phase locked loop (PLL) comprising a charge pump for adjusting a control current in response to performing frequency detection and phase detection with respect to an eight to fourteen modulation (EFM) signal and a PLL clock signal, and a voltage controlled oscillator for generating the PLL clock signal in response to a direct current control voltage corresponding to the adjusted current and in response to a predetermined reference voltage, the method comprising the steps of:

(a) determining whether the direct current control voltage changes in a predetermined operating mode;

(b) adjusting the direct current control voltage in a direction opposite to the change in direct current control voltage when it is determined that the direct current control voltage changes;

(c) determining whether the direct current control voltage is at a center voltage;

(d) generating the PLL clock signal corresponding to the direct current control voltage when it is determined that the direct current control voltage is at the center voltage; and (e) receiving the EFM signal and the PLL clock signal and performing frequency detection and phase detection with respect to the EFM signal and the PLL clock signal.

7. The method of claim 6, wherein step (b) comprises the steps of:

(b1) generating a triangular signal on the basis of the center value of the direct current control voltage;

(b2) comparing the direct current control voltage with the triangular signal and outputting a comparison result; and (b3) low-pass filtering the comparison result obtained in step (b2) to provide a filtered result and outputting the filtered result as the reference voltage.

* * * * *